United States Patent
Camacho et al.

(10) Patent No.: US 8,802,501 B2
(45) Date of Patent: Aug. 12, 2014

(54) INTEGRATED CIRCUIT PACKAGING SYSTEM WITH ISLAND TERMINALS AND METHOD OF MANUFACTURE THEREOF

(75) Inventors: Zigmund Ramirez Camacho, Singapore (SG); Henry Descalzo Bathan, Singapore (SG); Emmanuel Espiritu, Singapore (SG); Byung Tai Do, Singapore (SG); Arnel Senosa Trasporto, Singapore (SG); Linda Pei Ee Chua, Singapore (SG)

(73) Assignee: STATS ChipPAC Ltd., Singapore (SG)

( * ) Notice: Subject to any disclaimer, the term of this patent is extended or adjusted under 35 U.S.C. 154(b) by 270 days.

(21) Appl. No.: 13/188,456

(22) Filed: Jul. 21, 2011

(65) Prior Publication Data

US 2012/0018866 A1 Jan. 26, 2012

Related U.S. Application Data

(60) Provisional application No. 61/366,519, filed on Jul. 21, 2010, provisional application No. 61/366,522, filed on Jul. 21, 2010.

(51) Int. Cl.
*H01L 21/48* (2006.01)
(52) U.S. Cl.
CPC .................................. *H01L 21/4832* (2013.01)
USPC ........................................................ 438/123

(58) Field of Classification Search
None
See application file for complete search history.

(56) References Cited

U.S. PATENT DOCUMENTS

| | | | |
|---|---|---|---|
| 6,191,494 B1 | 2/2001 | Ooyama et al. | |
| 6,238,952 B1 | 5/2001 | Lin | |
| 7,271,032 B1 | 9/2007 | McLellan et al. | |
| 7,741,704 B2 | 6/2010 | Lange et al. | |
| 2009/0278242 A1 | 11/2009 | Chuang et al. | |
| 2011/0068463 A1 | 3/2011 | Camacho et al. | |
| 2011/0079885 A1 | 4/2011 | Camacho et al. | |
| 2011/0079886 A1 | 4/2011 | Bathan et al. | |
| 2011/0108966 A1* | 5/2011 | Bathan et al. | 257/676 |

OTHER PUBLICATIONS

U.S. Appl. No. 12/884,073, filed Sep. 16, 2010, Camacho et al.
U.S. Appl. No. 13/071,433, filed Mar. 24, 2011, Camacho et al.
U.S. Appl. No. 13/187,505, filed Jul. 20, 2011, Camacho et al.

* cited by examiner

*Primary Examiner* — Fernando L Toledo
*Assistant Examiner* — Valerie N Newton
(74) *Attorney, Agent, or Firm* — Ishimaru & Associates LLP

(57) ABSTRACT

A method of manufacture of an integrated circuit packaging system includes: providing a package paddle having an upper hole below a paddle top side, the upper hole bounded by an upper non-horizontal side with a curve surface; forming a terminal adjacent the package paddle; mounting an integrated circuit on the paddle top side; and forming an encapsulation within the upper hole.

22 Claims, 10 Drawing Sheets

INTEGRATED CIRCUIT PACKAGING SYSTEM WITH ISLAND TERMINALS AND METHOD OF MANUFACTURE THEREOF

CROSS-REFERENCE TO RELATED APPLICATION(S)

This application claims the benefit of U.S. Provisional Patent Application Ser. No. 61/366,519 filed Jul. 21, 2010, and the subject matter thereof is incorporated herein by reference thereto.

This application also claims the benefit of U.S. Provisional Patent Application Ser. No. 61/366,522 filed Jul. 21, 2010, and the subject matter thereof is incorporated herein by reference thereto.

TECHNICAL FIELD

The present invention relates generally to an integrated circuit packaging system, and more particularly to a system with terminals.

BACKGROUND ART

Semiconductor chips have become progressively more complex, driven in large part by the need for increasing processing power in a smaller chip size for compact or portable electronic devices such as cell phones, smart phones, personal media systems, ultraportable computers.

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps, or other suitable electrical connections.

In general, the die and portions of the leadframe are encapsulated with a molding material to protect the delicate electrical components on the active side of the die while leaving selected portions of the leadframe exposed to facilitate electrical connection to external devices.

In response to the smaller chip size, packaging technologies have evolved, for example, to enable an increased lead density, which can reduce the footprint area of a package mounted on a printed circuit board (PCB). Some packaging technologies may enable this increased lead density by providing rows of leads connected to a disposable portion of a leadframe.

However, manufacturing processes for such leadframes may not be scalable. As lead density requirements further increase, it may be desirable to use packaging technologies that are more scalable in terms of lead density.

Moreover, it may be desirable to further reduce package size in additional ways. At the same time, it may be desirable to maintain sufficient structural integrity and to facilitate surface mounting of the package to a PCB. It may also be desirable to formulate a packaging process designed to meet these objectives. Current packaging solutions can meet some of these objectives but may not be able to meet most, or all, of these objectives.

Thus, a need still remains for a high reliability package for use with high temperature processes. In view of this need, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a package paddle having an upper hole below a paddle top side, the upper hole bounded by an upper non-horizontal side with a curve surface; forming a terminal adjacent the package paddle; mounting an integrated circuit on the paddle top side; and forming an encapsulation within the upper hole.

The present invention provides a method of manufacture of an integrated circuit packaging system including: providing a package paddle having a paddle bottom side, a paddle bottom conductive layer, and a lower non-horizontal side with the lower non-horizontal side having a curve surface; forming a terminal adjacent the package paddle, the terminal having a terminal bottom side and a terminal lower portion with the terminal lower portion having a non-horizontal extent facing the lower non-horizontal side; mounting an integrated circuit over the package paddle; and forming an encapsulation over the integrated circuit, the encapsulation covering the non-horizontal extent and the lower non-horizontal side, the encapsulation having an encapsulation bottom side horizontally extending from the paddle bottom side to the terminal bottom side.

The present invention provides an integrated circuit packaging system, including: a package paddle having an upper hole below a paddle top side, the upper hole bounded by an upper non-horizontal side with a curve surface; a terminal adjacent the package paddle; an integrated circuit on the paddle top side; and an encapsulation within the upper hole.

The present invention provides an integrated circuit packaging system, including: a package paddle having a paddle bottom side, a paddle bottom conductive layer, and a lower non-horizontal side with the lower non-horizontal side having a curve surface; a terminal adjacent the package paddle, the terminal having a terminal bottom side and a terminal lower portion with the terminal lower portion having a non-horizontal extent facing the lower non-horizontal side; an integrated circuit over the package paddle; and an encapsulation over the integrated circuit, the encapsulation covering the non-horizontal extent and the lower non-horizontal side, the encapsulation having an encapsulation bottom side horizontally extending from the paddle bottom side to the terminal bottom side.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
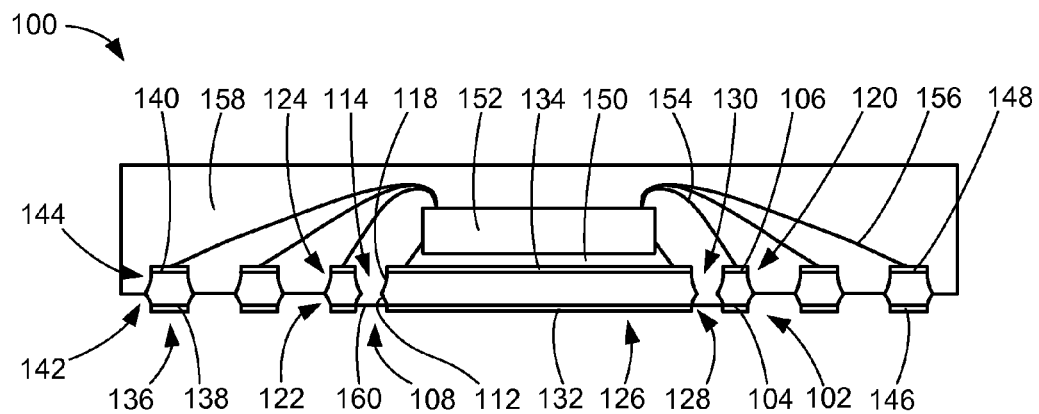
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

A problem can occur due to a paddle unexpectedly completely and cleanly detached from a package during surface mounting at an end customer's site. The paddle detaches during a high-temp process, which is unavoidable for a package in surface mount technology (SMT).

A conventional paddle partially embedded in an encapsulant is prone to this detachment. This severely affects workability of these packages and thus does not increase end-user confidence. Support is required to prevent a paddle from falling out of a package. Embodiments of the present invention provide answers or solutions to the problems.

Figure 2:
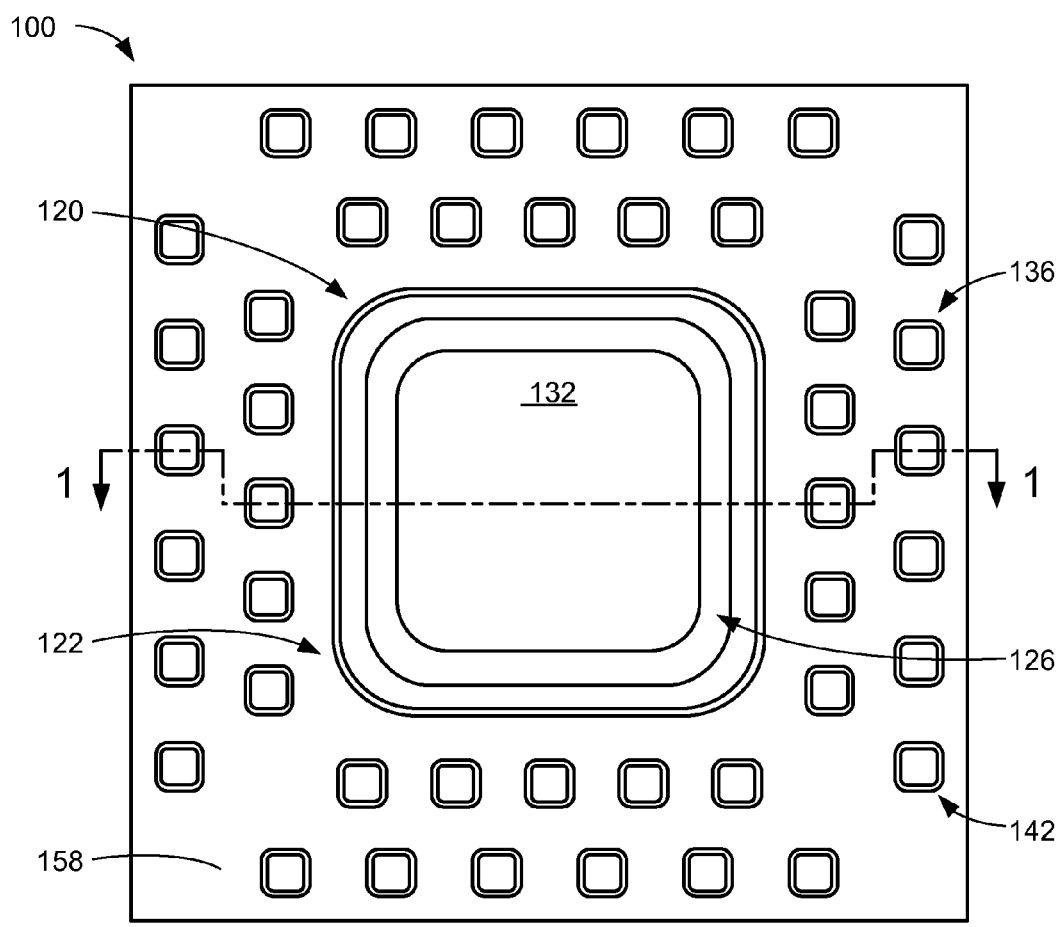
FIG. 2 is a bottom view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can include an undercut locking structure.

The integrated circuit packaging system 100 can include a package paddle 102, which is defined as a support structure for mounting and connecting an integrated circuit device thereon. The package paddle 102 can include a paddle bottom side 104 and a paddle top side 106. The package paddle 102 can represent a die pad.

The package paddle 102 can include a lower hole 108 opposite an upper hole 114 and bounded by a lower non-horizontal side 112. The lower non-horizontal side 112 can include a curve or concave surface. The package paddle 102 can include the upper hole 114 bounded by an upper non-horizontal side 118. The upper non-horizontal side 118 can include a curve or concave surface.

The package paddle 102, having the lower hole 108 and the upper hole 114, can represent a slotted paddle. The package paddle 102 can include the lower hole 108 and the upper hole 114 providing spacing vertically through the package paddle 102.

The lower non-horizontal side 112 can be connected to the paddle bottom side 104 and the upper non-horizontal side 118. The upper non-horizontal side 118 can be connected to the lower non-horizontal side 112 and the paddle top side 106. The lower non-horizontal side 112 can be connected to the upper non-horizontal side 118 forming a ridge.

The package paddle 102 can include a paddle peripheral portion 120 having a paddle peripheral lower portion 122 and a paddle peripheral upper portion 124. The package paddle 102 can include a paddle central portion 126 having a paddle central lower portion 128 and a paddle central upper portion 130.

The paddle peripheral portion 120 is defined as a portion of the package paddle 102 that is horizontally farther from the center of the package paddle 102 than the paddle central portion 126 from the center of the package paddle 102. The paddle peripheral portion 120 can be adjacent and surrounding the paddle central portion 126. The paddle central portion 126 is defined as a portion of the package paddle 102 that is at the center of the package paddle 102.

The lower hole 108 defines spacing between the paddle peripheral lower portion 122 and the paddle central lower portion 128. The upper hole 114 defines spacing horizontally between the paddle peripheral upper portion 124 and the paddle central upper portion 130.

The package paddle 102 can include a paddle bottom conductive layer 132, which is defined as a conductor that provides electrical connectivity between the package paddle 102 and an external system (not shown). The paddle bottom conductive layer 132 can be formed directly on the paddle bottom side 104 at the paddle peripheral lower portion 122 and the paddle central lower portion 128.

The package paddle 102 can include a paddle top conductive layer 134, which is defined as a conductor that provides electrical connectivity between the package paddle 102 and an integrated circuit device. The paddle top conductive layer 134 can be formed directly on the paddle top side 106 at the paddle peripheral upper portion 124 and the paddle central upper portion 130.

The integrated circuit packaging system 100 can include terminals 136, which are defined as connectors providing electrical connectivity between an integrated circuit device and the external system. The terminals 136 can be formed adjacent and surrounding the paddle peripheral portion 120. For example, the terminals 136 can represent island terminals that are isolated from each other.

The terminals 136 can be electrically isolated from the package paddle 102. Each of the terminals 136 can include a terminal bottom side 138 and a terminal top side 140. Each of the terminals 136 can include a terminal lower portion 142 and a terminal upper portion 144.

Each of the terminals 136 can include a terminal bottom conductive layer 146, which is defined as a conductor that provides electrical connectivity between each of the terminals 136 and the external system. The terminal bottom conductive layer 146 can be formed directly on the terminal bottom side 138 at the terminal lower portion 142.

Each of the terminals 136 can include a terminal top conductive layer 148, which is defined as a conductor that provides electrical connectivity between each of the terminals 136 and an integrated circuit device. The terminal top conductive layer 148 can be formed directly on the terminal top side 140 at the terminal upper portion 144.

The paddle bottom side 104 and the terminal bottom side 138 can be coplanar with each other. The paddle bottom conductive layer 132 and the terminal bottom conductive layer 146 can be coplanar with each other. The paddle top side 106 and the terminal top side 140 can be coplanar with each other. The paddle top conductive layer 134 and the terminal top conductive layer 148 can be coplanar with each other.

The integrated circuit packaging system 100 can include an attach layer 150, which is defined as a die attach material or an adhesive material. The integrated circuit packaging system 100 can include an integrated circuit 152, which is defined as a semiconductor device, having an inactive side attached to the paddle top conductive layer 134 with the attach layer 150. The integrated circuit 152 can be mounted with the inactive side over the paddle central upper portion 130. The integrated circuit 152 can be mounted on the paddle top side 106.

The integrated circuit packaging system 100 can include paddle-device connectors 154 and terminal-device connectors 156, which are defined as electrical connectors. The paddle-device connectors 154 can be attached to an active side of the integrated circuit 152 and the paddle top conductive layer 134. Each of the terminal-device connectors 156 can be connected to the active side and the terminal top conductive layer 148.

The integrated circuit packaging system 100 can include an encapsulation 158, which is defined as a package cover of a semiconductor package to seal an integrated circuit device providing mechanical and environmental protection. The encapsulation 158 can be formed over the package paddle 102, the terminals 136, the attach layer 150, the integrated circuit 152, the paddle-device connectors 154, and the terminal-device connectors 156.

The encapsulation 158 can cover the lower non-horizontal side 112 within the lower hole 108. The encapsulation 158 can cover the upper non-horizontal side 118 within the upper hole 114. The encapsulation 158 can cover the paddle peripheral upper portion 124, the paddle central upper portion 130, and the terminal upper portion 144.

The encapsulation 158 can expose a portion of the paddle peripheral lower portion 122 facing the terminals 136. The encapsulation 158 can expose the terminal lower portion 142. The encapsulation 158 can include an encapsulation bottom side 160 coplanar with the paddle bottom side 104.

It has been discovered that the package paddle 102 improves reliability by providing additional surface areas within the lower hole 108 and the upper hole 114 for the encapsulation 158 to form thereon thereby eliminating paddle detachment.

It has also been discovered that the lower non-horizontal side 112 and the upper non-horizontal side 118 having curve or concave surfaces covered by the encapsulation 158 improves paddle interlocking providing improved reliability.

Referring now to FIG. 2, therein is shown a bottom view of the integrated circuit packaging system 100. The bottom view depicts the paddle bottom conductive layer 132 at the paddle peripheral portion 120 and the paddle central portion 126.

The encapsulation 158 can be formed between the paddle peripheral portion 120 and the paddle central portion 126. The encapsulation 158 can be formed between the paddle peripheral lower portion 122 and the terminal lower portion 142. The encapsulation 158 can be formed between one of the terminals 136 and another of the terminals 136.

Figure 3:
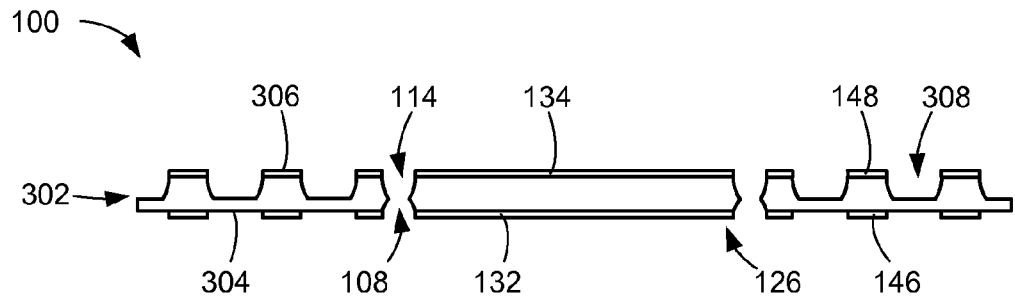
FIG. 3 is a cross-sectional view of the integrated circuit packaging system in a leadframe-providing phase of manufacture.

Referring now to FIG. 3, therein is shown a cross-sectional view of the integrated circuit packaging system 100 in a leadframe-providing phase of manufacture. The integrated circuit packaging system 100 can include a leadframe 302, which is defined as a structure providing support and connectivity for an integrated circuit device.

The leadframe 302 can include a leadframe bottom side 304 and a leadframe top side 306. The leadframe 302 can include a partially removed region 308 extending below the leadframe top side 306. The leadframe 302 can include the lower hole 108 and the upper hole 114, both of which can provide a slot through the leadframe 302 from the leadframe bottom side 304 to the leadframe top side 306.

The leadframe 302 can include the paddle bottom conductive layer 132 and the terminal bottom conductive layer 146 with both formed directly on the leadframe bottom side 304. The leadframe 302 can include the paddle top conductive layer 134 and the terminal top conductive layer 148 with both formed directly on the leadframe top side 306.

The leadframe 302 can be formed with an electrically conductive material including copper (Cu) or any other metallic material. The leadframe 302 can be formed with a material that can be etched or partially removed.

The paddle bottom conductive layer 132, the paddle top conductive layer 134, the terminal bottom conductive layer 146, and the terminal top conductive layer 148 can be formed with a pattern process including a pre-plated leadframe (PPF) plating process. The paddle bottom conductive layer 132, the paddle top conductive layer 134, the terminal bottom conductive layer 146, and the terminal top conductive layer 148 can be formed with a material that is resistant to a removal process including etching.

The paddle bottom conductive layer 132, the paddle top conductive layer 134, the terminal bottom conductive layer 146, and the terminal top conductive layer 148 can include a conductive material or a metal alloy. For example, the paddle bottom conductive layer 132, the paddle top conductive layer 134, the terminal bottom conductive layer 146, and the terminal top conductive layer 148 can include nickel (Ni), palladium (Pd), gold (Au), or any combination thereof. For a specific example, the paddle bottom conductive layer 132, the paddle top conductive layer 134, the terminal bottom conductive layer 146, and the terminal top conductive layer 148 can include nickel-palladium-gold.

The partially removed region 308, the lower hole 108, and the upper hole 114 can be formed with a removal process including etching by removing portions of the leadframe 302 around the paddle bottom conductive layer 132, the paddle top conductive layer 134, the terminal bottom conductive layer 146, and the terminal top conductive layer 148. The removal process can be performed to remove portions of the leadframe 302 at the leadframe top side 306 to form the partially removed region 308 and the upper hole 114.

The leadframe bottom side 304 can optionally be covered with a resistant material, including a coverlay tape, a molding backside tape, or polyimide, that is resistant to the removal process. The leadframe bottom side 304 can be partially removed to form an opening, depicted as the lower hole 108, forming the paddle central portion 126. The lower hole 108 can be around the paddle central portion 126.

The leadframe bottom side 304 can be partially removed with the removal process forming the lower hole 108 leaving an undercut in the leadframe 302 at the leadframe bottom side 304. The undercut is a removed portion of the leadframe 302 that leaves an overhanging portion in relief.

Figure 4:
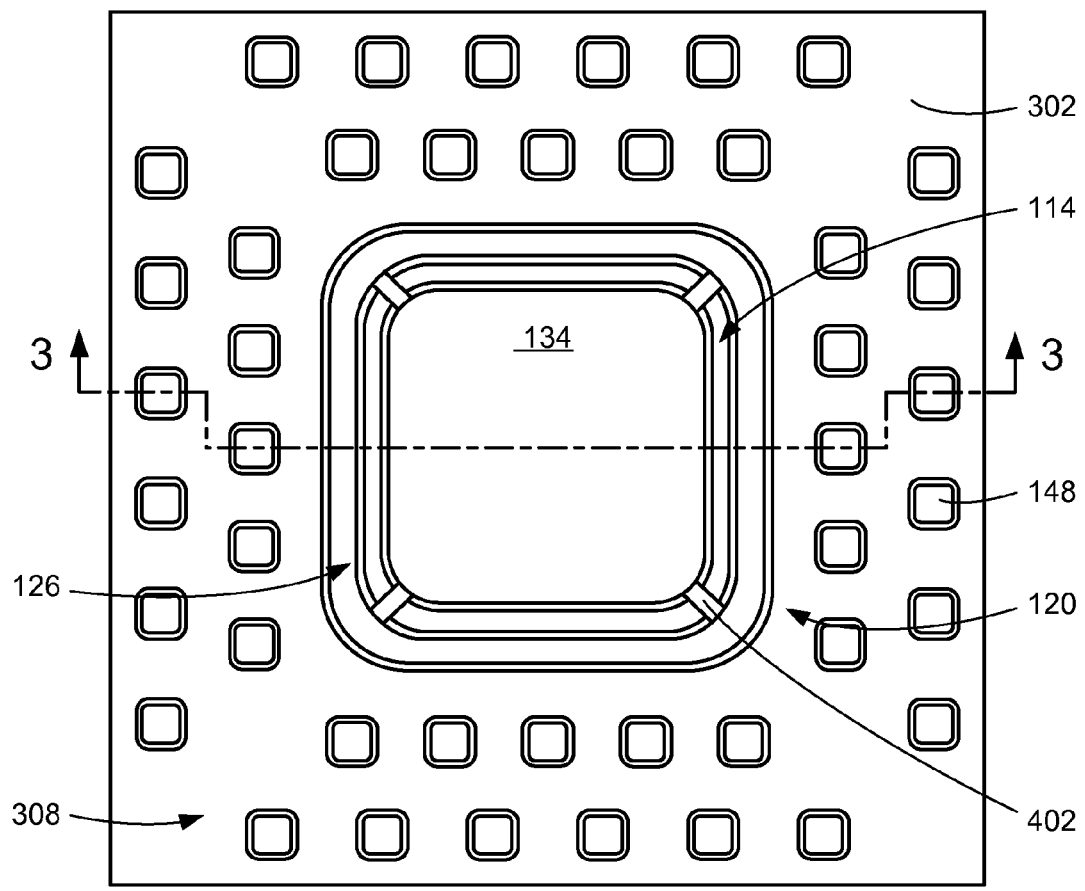
FIG. 4 is a top view of the leadframe.

Referring now to FIG. 4, therein is shown a top view of the leadframe 302. The top view depicts the leadframe 302 having the paddle top conductive layer 134 at the paddle central portion 126 surrounded by the upper hole 114. The upper hole 114 can provide spacing between the paddle top conductive layer 134 at the paddle central portion 126 and the paddle top conductive layer 134 at the paddle peripheral portion 120 of FIG. 1, which will be formed in a subsequent phase. The paddle top conductive layer 134 at the paddle peripheral portion 120 can be formed to provide a ground (GND) ring.

The leadframe 302 can include the partially removed region 308 surrounding the terminal top conductive layer 148. The leadframe 302 can include paddle tiebars 402 connecting top portions of the leadframe 302 together. The paddle tiebars 402 define or provide spacing for openings, depicted as the upper hole 114, through the structure of the leadframe 302. The paddle tiebars 402 can be removed with a removal process including etching.

For example, the paddle tiebars 402 are shown at or near corners of the paddle central portion 126. Also for example, the paddle tiebars 402 can represent half-etched tiebars.

For illustration purposes, a number of the terminal top conductive layer 148 are shown diagonally offset from each other for higher terminal density, although it is be understood that the terminal top conductive layer 148 can be formed in any configuration. For example, a number of the terminal top conductive layer 148 can be formed in multiple rows in a non-staggered or non-offset configuration.

It has been discovered that by providing connectors, such as the paddle tiebars 402, that can be etched away when the island terminals are formed, the integrated circuit packaging method of manufacture and the product of the present invention furnishes important and heretofore unknown and unavailable solutions, capabilities, and functional aspects for the integrated circuit packaging system.

Figure 5:
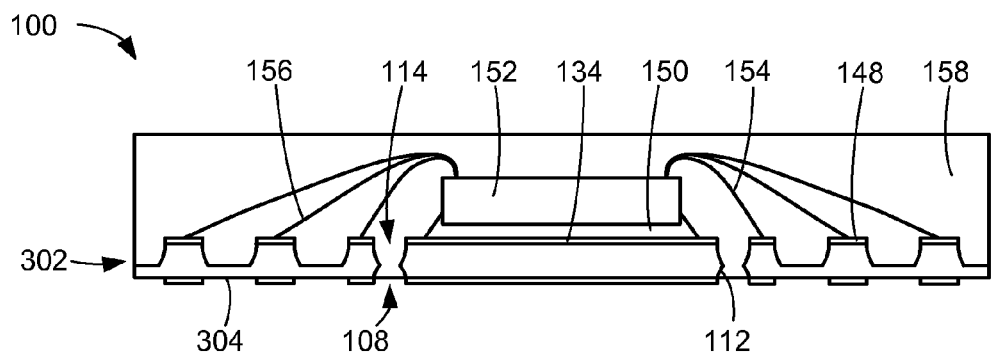
FIG. 5 is the structure of FIG. 3 in a molding phase.

Referring now to FIG. 5, therein is shown the structure of FIG. 3 in a molding phase. The integrated circuit packaging system 100 can include an attach process including die attach to attach the integrated circuit 152 to the paddle top conductive layer 134 with the attach layer 150.

The integrated circuit packaging system 100 can include a connection process including wire bonding to attach the paddle-device connectors 154 to the integrated circuit 152 and the paddle top conductive layer 134. The connection process can also be performed to attach the terminal-device connectors 156 to the integrated circuit 152 and the terminal top conductive layer 148.

The encapsulation 158 can be formed over the integrated circuit 152, the paddle-device connectors 154, and the terminal-device connectors 156. The encapsulation 158 can be formed within the lower hole 108 and the upper hole 114. The encapsulation 158 can be formed with a molding material including an epoxy molding compound (EMC) or an encapsulant.

The integrated circuit packaging system 100 can include a removal process including etching to form island terminals, such as the terminals 136 of FIG. 1, and an embedded paddle, such as the package paddle 102 of FIG. 1. An undercut, such as the lower non-horizontal side 112, can be filled with the encapsulation 158 to positively lock in the package paddle 102 in the encapsulation 158. A portion of the package paddle 102 can be substantially embedded in the encapsulation 158.

The removal process can be performed to remove the paddle tiebars 402 of FIG. 4. The removal process including a back-etch process can be performed to remove portions of the leadframe 302 at the leadframe bottom side 304 forming the terminals 136 spaced away and isolated from each other and the package paddle 102.

Figure 6:
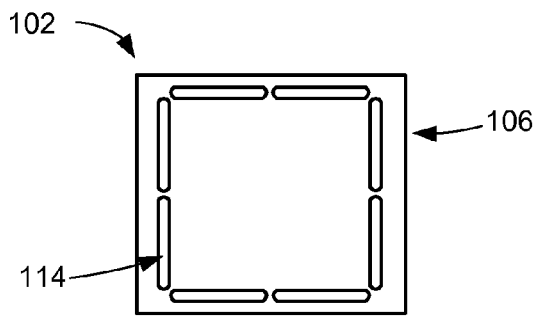
FIG. 6 is an exemplary top view of the package paddle.

Referring now to FIG. 6, therein is shown an exemplary top view of the package paddle 102. The exemplary top view provides an alternative embodiment of the package paddle 102 different from a structure of the package paddle 102 shown in FIG. 2.

The exemplary top view depicts the package paddle 102 having a number of the upper hole 114 to be filled with the encapsulation 158 of FIG. 1. The upper hole 114 can be formed along a periphery of the package paddle 102.

For illustration purposes, a number of the upper hole 114 is shown with two straight elongated slots adjacent each side of the package paddle 102, although it is understood that the upper hole 114 can be formed with any number of straight elongated slots. For illustration purposes, the upper hole 114 is shown along a periphery of the package paddle 102, although it is understood that the upper hole 114 can be formed at any location at the paddle top side 106.

For illustration purposes, the upper hole 114 is shown with round rectangles, although it is understood that the upper hole 114 can include any other configurations. For example, the upper hole 114 can be formed in a single ring slot.

Figure 7:
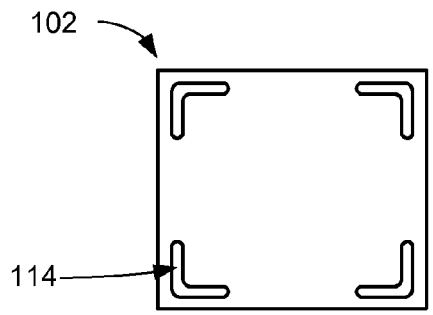
FIG. 7 is another exemplary top view of the package paddle.

Referring now to FIG. 7, therein is shown another exemplary top view of the package paddle 102. The another exemplary top view provides another alternative embodiment of the package paddle 102 different from a structure of the package paddle 102 shown in FIG. 2.

The another exemplary top view depicts the package paddle 102 having a number of the upper hole 114 to be filled with the encapsulation 158 of FIG. 1. The upper hole 114 can be formed at a corner of the package paddle 102.

The upper hole 114 can include elongated slots having right angle bends and adjacent the sides of the package paddle 102. For illustration purposes, the upper hole 114 is shown with rectangles with round corners, although it is understood that the upper hole 114 can include any other configurations.

Figure 8:
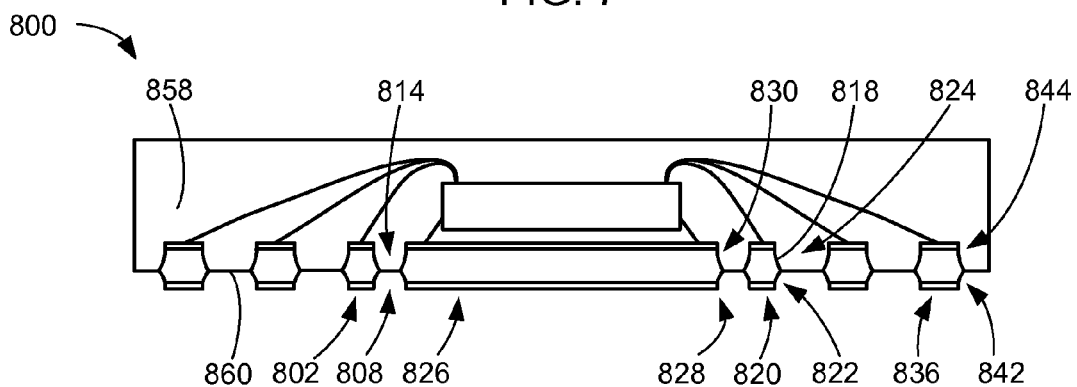
FIG. 8 is a cross-sectional view of an integrated circuit packaging system in a second embodiment of the present invention.

Referring now to FIG. 8, therein is shown a cross-sectional view of an integrated circuit packaging system 800 in a second embodiment of the present invention. The integrated circuit packaging system 800 is similar to the integrated circuit packaging system 100 of FIG. 1. In a manner similar to the integrated circuit packaging system 100, the integrated circuit packaging system 800 includes a package paddle 802 having a lower hole 808, an upper hole 814, a paddle peripheral portion 820, and a paddle central portion 826. In a manner similar to the integrated circuit packaging system 100, the integrated circuit packaging system 800 includes terminals 836 and an encapsulation 858.

The encapsulation 858 can cover an upper non-horizontal side 818 within the upper hole 814. The encapsulation 858 can cover a paddle peripheral upper portion 824, a paddle central upper portion 830, and a terminal upper portion 844.

The encapsulation 858 can expose a paddle peripheral lower portion 822. The encapsulation 858 can expose a terminal lower portion 842. The encapsulation 858 can include an encapsulation bottom side 860 exposed within the lower hole 808. The paddle peripheral lower portion 822, a paddle central lower portion 828, and the terminal lower portion 842 can protrude from and below the encapsulation bottom side 860.

It has been discovered that the package paddle 802 improves reliability by providing additional surface area within the upper hole 814 for the encapsulation 858 to form thereon thereby eliminating paddle detachment.

It has also been discovered that the upper non-horizontal side 818 having a curve or concave surface covered by the encapsulation 858 improves paddle interlocking providing improved reliability.

Figure 9:
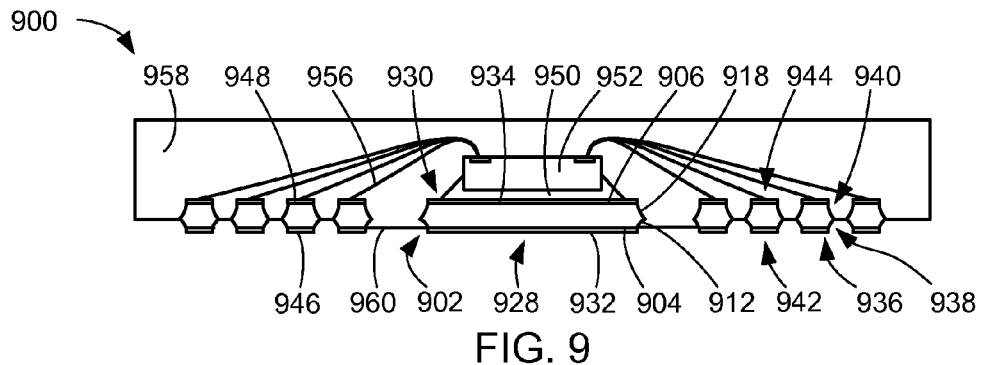
FIG. 9 is a cross-sectional view of an integrated circuit packaging system in a third embodiment of the present invention.

Referring now to FIG. 9, therein is shown a cross-sectional view of an integrated circuit packaging system 900 in a third embodiment of the present invention. The integrated circuit packaging system 900 can include a package paddle 902, which is defined as a support structure for mounting and connecting an integrated circuit device thereon. The package paddle 902 can include a paddle bottom side 904 and a paddle top side 906. The package paddle 902 can represent a die pad.

The package paddle 902 can include a lower non-horizontal side 912. The lower non-horizontal side 912 can include a curve or concave surface. The package paddle 902 can include an upper non-horizontal side 918. The upper non-horizontal side 918 can include a curve or concave surface. The package paddle 902 can include a paddle lower portion 928 and a paddle upper portion 930.

The lower non-horizontal side 912 can be connected to the paddle bottom side 904 and the upper non-horizontal side 918. The upper non-horizontal side 918 can be connected to the lower non-horizontal side 912 and the paddle top side 906. The lower non-horizontal side 912 can be connected to the upper non-horizontal side 918 forming a ridge.

The package paddle 902 can include a paddle bottom conductive layer 932, which is defined as a conductor that provides electrical connectivity between the package paddle 902 and an external system (not shown). The paddle bottom conductive layer 932 can be formed directly on the paddle bottom side 904 at the paddle lower portion 928.

The package paddle 902 can include a paddle top conductive layer 934, which is defined as a conductor that provides electrical connectivity between the package paddle 902 and an integrated circuit device. The paddle top conductive layer 934 can be formed directly on the paddle top side 906 at the paddle upper portion 930.

The integrated circuit packaging system 900 can include terminals 936, which are defined as connectors providing electrical connectivity between an integrated circuit device and the external system. The terminals 936 can be adjacent and surrounding the package paddle 902. For example, the terminals 936 can represent island terminals that are isolated from each other.

The terminals 936 can be electrically isolated from the package paddle 902. Each of the terminals 936 can include a terminal bottom side 938 and a terminal top side 940. Each of the terminals 936 can include a terminal lower portion 942 and a terminal upper portion 944.

Each of the terminals 936 can include a terminal bottom conductive layer 946, which is defined as a conductor that provides electrical connectivity between each of the terminals 936 and the external system. The terminal bottom conductive layer 946 can be formed directly on the terminal bottom side 938 at the terminal lower portion 942.

Each of the terminals 936 can include a terminal top conductive layer 948, which is defined as a conductor that provides electrical connectivity between each of the terminals 936 and an integrated circuit device. The terminal top conductive layer 948 can be formed directly on the terminal top side 940 at the terminal upper portion 944.

The paddle bottom side 904 and the terminal bottom side 938 can be coplanar with each other. The paddle bottom conductive layer 932 and the terminal bottom conductive layer 946 can be coplanar with each other. The paddle top side 906 and the terminal top side 940 can be coplanar with each other. The paddle top conductive layer 934 and the terminal top conductive layer 948 can be coplanar with each other.

The integrated circuit packaging system 900 can include an attach layer 950, which is defined as a die attach material or an adhesive material. The integrated circuit packaging system 900 can include an integrated circuit 952, which is defined as a semiconductor device, having an inactive side attached to the paddle top conductive layer 934 with the attach layer 950. The integrated circuit 952 can be mounted with the inactive side over the paddle upper portion 930.

The integrated circuit packaging system 900 can include terminal-device connectors 956, which are defined as electrical connectors. Each of the terminal-device connectors 956 can be connected to an active side of the integrated circuit 952 and the terminal top conductive layer 948.

The integrated circuit packaging system 900 can include an encapsulation 958, which is defined as a package cover of a semiconductor package to seal an integrated circuit device providing mechanical and environmental protection. The encapsulation 958 can be formed over the package paddle 902, the terminals 936, the attach layer 950, the integrated circuit 952, and the terminal-device connectors 956.

The encapsulation 958 can cover the upper non-horizontal side 918. The encapsulation 958 can cover the paddle lower portion 928, the paddle upper portion 930, and the terminal upper portion 944.

The encapsulation 958 can cover the lower non-horizontal side 912 and a non-horizontal extent of the terminal lower portion 942 with the non-horizontal extent facing the lower non-horizontal side 912. The encapsulation 958 can include an encapsulation bottom side 960. The encapsulation bottom side 960 can be coplanar with the paddle bottom side 904 and the terminal bottom side 938. The encapsulation bottom side 960 can horizontally extend from the paddle bottom side 904 to the terminal bottom side 938.

It has been discovered that the upper non-horizontal side 918 having a curve or concave surface covered by the encapsulation 958 improves paddle interlocking providing improved reliability.

Figure 10:
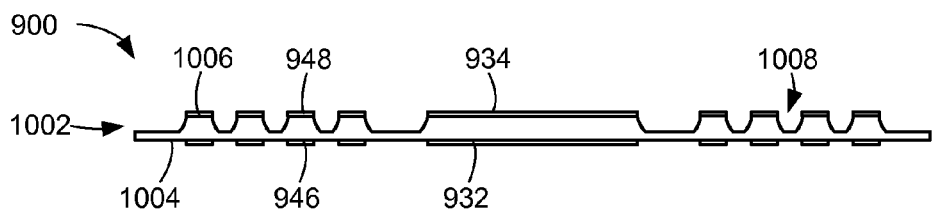
FIG. 10 is a cross-sectional view of the integrated circuit packaging system in a leadframe-providing phase of manufacture.

Referring now to FIG. 10, therein is shown a cross-sectional view of the integrated circuit packaging system 900 in a leadframe-providing phase of manufacture. The integrated circuit packaging system 900 can include a leadframe 1002, which is defined as a structure providing support and connectivity for an integrated circuit device.

The leadframe 1002 can include a leadframe bottom side 1004 and a leadframe top side 1006. The leadframe 1002 can include a partially removed region 1008 extending from and below the leadframe top side 1006.

The leadframe 1002 can include the paddle bottom conductive layer 932 and the terminal bottom conductive layer 946 with both formed directly on the leadframe bottom side 1004. The leadframe 1002 can include the paddle top conductive layer 934 and the terminal top conductive layer 948 with both formed directly on the leadframe top side 1006.

The leadframe 1002 can be formed with an electrically conductive material including copper (Cu) or any other metallic material. The leadframe 1002 can be formed with a material that can be etched or partially removed.

The paddle bottom conductive layer 932, the paddle top conductive layer 934, the terminal bottom conductive layer 946, and the terminal top conductive layer 948 can be formed with a pattern process including a pre-plated leadframe (PPF) plating process. The paddle bottom conductive layer 932, the paddle top conductive layer 934, the terminal bottom conductive layer 946, and the terminal top conductive layer 948 can be formed with a material that is resistant to a removal process including etching.

The paddle bottom conductive layer 932, the paddle top conductive layer 934, the terminal bottom conductive layer 946, and the terminal top conductive layer 948 can include a conductive material or a metal alloy. For example, the paddle bottom conductive layer 932, the paddle top conductive layer 934, the terminal bottom conductive layer 946, and the terminal top conductive layer 948 can include nickel (Ni), palladium (Pd), gold (Au), or any combination thereof. For a specific example, the paddle bottom conductive layer 932, the paddle top conductive layer 934, the terminal bottom conductive layer 946, and the terminal top conductive layer 948 can include nickel-palladium-gold.

The partially removed region 1008 can be formed with a removal process including etching by removing portions of the leadframe 1002 around the paddle top conductive layer 934 and the terminal top conductive layer 948. The removal process can be performed to remove portions of the leadframe 1002 at the leadframe top side 1006 to form the partially removed region 1008.

Figure 11:
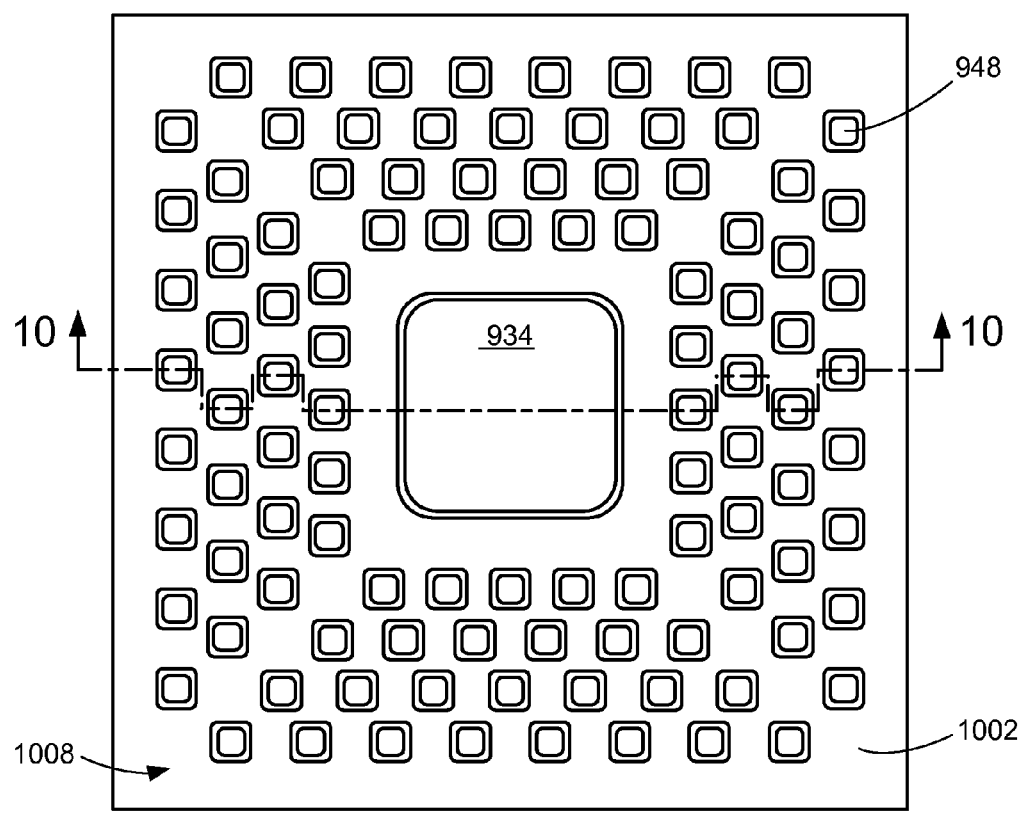
FIG. 11 is a top view of the leadframe.

Referring now to FIG. 11, therein is shown a top view of the leadframe. The top view depicts the leadframe 1002 having the paddle top conductive layer 934. The leadframe 1002 can include the partially removed region 1008 surrounding the terminal top conductive layer 948.

For illustration purposes, a number of the terminal top conductive layer 948 are shown diagonally offset from each other for higher terminal density, although it is be understood that the terminal top conductive layer 948 can be formed in any configuration. For example, a number of the terminal top conductive layer 948 can be formed in multiple rows in a non-staggered or non-offset configuration.

Figure 12:
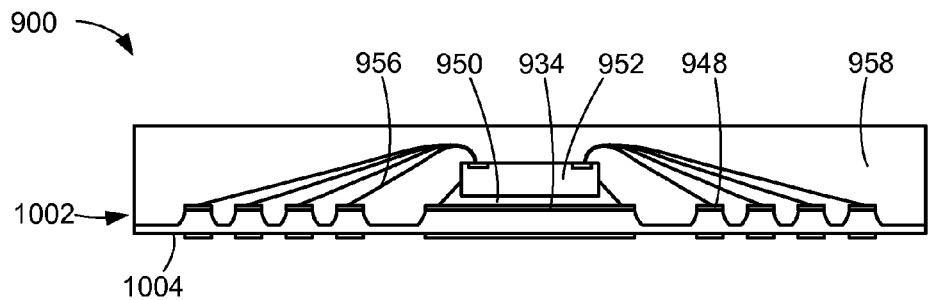
FIG. 12 is the structure of FIG. 10 in a molding phase.

Referring now to FIG. 12, therein is shown the structure of FIG. 10 in a molding phase. The integrated circuit packaging system 900 can include an attach process including die attach to attach the integrated circuit 952 to the paddle top conductive layer 934 with the attach layer 950. The integrated circuit packaging system 900 can include a connection process including wire bonding to attach the terminal-device connectors 956 to the integrated circuit 952 and the terminal top conductive layer 948. The encapsulation 958 can be formed over the integrated circuit 952 and the terminal-device connectors 956.

The integrated circuit packaging system 900 can include a removal process including etching to form island terminals, such as the terminals 936 of FIG. 9, and an embedded paddle, such as the package paddle 902 of FIG. 9. A portion of the package paddle 902 can be substantially embedded in the encapsulation 958. The removal process including a back-etch process can be performed to remove portions of the leadframe 1002 at the leadframe bottom side 1004 forming the terminals 936 spaced away and isolated from each other and the package paddle 902.

Figure 13:
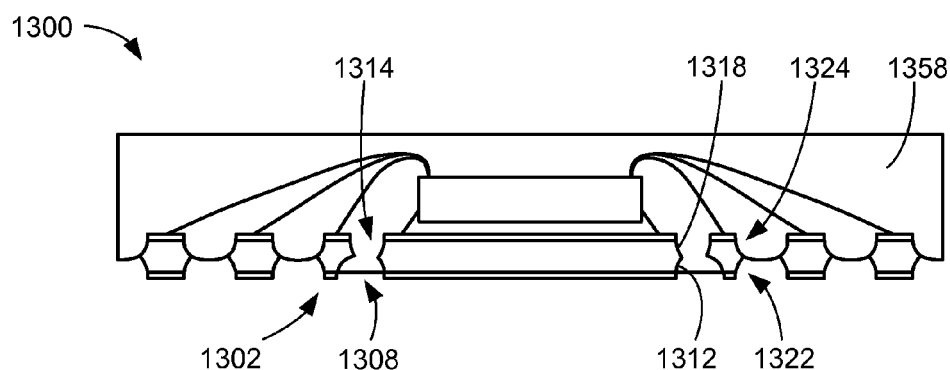
FIG. 13 is a cross-sectional view of an integrated circuit packaging system in a fourth embodiment of the present invention.

Referring now to FIG. 13, therein is shown a cross-sectional view of an integrated circuit packaging system 1300 in a fourth embodiment of the present invention. The integrated circuit packaging system 1300 can include an EMC extending to a paddle edge periphery. The integrated circuit packaging system 1300 is similar to the integrated circuit packaging system 100 of FIG. 1.

In a manner similar to the integrated circuit packaging system 100, the integrated circuit packaging system 1300 includes a package paddle 1302 having a lower hole 1308 with a lower non-horizontal side 1312. In a manner similar to the integrated circuit packaging system 100, the package paddle 1302 includes an upper hole 1314 with an upper non-horizontal side 1318. In a manner similar to the integrated circuit packaging system 100, the integrated circuit packaging system 1300 includes an encapsulation 1358.

The package paddle 1302 is shown with a paddle peripheral lower portion 1322 having a deeper undercut. As used herein, the term deeper undercut means that an undercut is deeper than a cut forming a concave surface of a paddle peripheral upper portion 1324. With the deeper undercut, the paddle peripheral lower portion 1322 includes a horizontal width less than a horizontal width of the paddle peripheral upper portion 1324.

It has been discovered that the package paddle 1302 improves reliability by providing additional surface areas within the lower hole 1308 and the upper hole 1314 for the encapsulation 1358 to form thereon thereby eliminating paddle detachment.

It has also been discovered that the lower non-horizontal side 1312 and the upper non-horizontal side 1318 having curve or concave surfaces covered by the encapsulation 1358 improves paddle interlocking providing improved reliability.

It has further been discovered that the paddle peripheral lower portion 1322 having the deeper undercut further improves reliability with increased surface area of the paddle peripheral lower portion 1322 for the encapsulation 1358 to form thereon.

Figure 14:
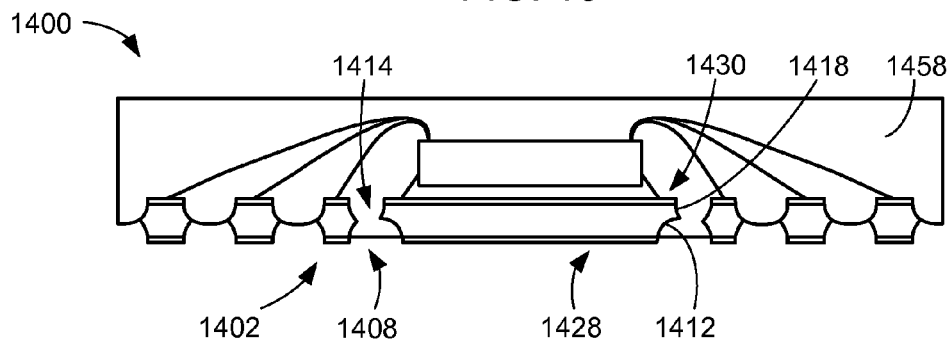
FIG. 14 is a cross-sectional view of an integrated circuit packaging system in a fifth embodiment of the present invention.

Referring now to FIG. 14, therein is shown a cross-sectional view of an integrated circuit packaging system 1400 in a fifth embodiment of the present invention. The integrated circuit packaging system 1400 can include an EMC extending inward paddle area. The integrated circuit packaging system 1400 is similar to the integrated circuit packaging system 100 of FIG. 1.

In a manner similar to the integrated circuit packaging system 100, the integrated circuit packaging system 1400 includes a package paddle 1402 having a lower hole 1408 with a lower non-horizontal side 1412. In a manner similar to the integrated circuit packaging system 100, the package paddle 1402 includes an upper hole 1414 with an upper non-horizontal side 1418. In a manner similar to the integrated circuit packaging system 100, the integrated circuit packaging system 1400 includes an encapsulation 1458.

The package paddle 1402 is shown with a paddle central lower portion 1428 having a deeper undercut. As used herein, the term deeper undercut means that an undercut is deeper than a cut forming a concave surface of a paddle central upper portion 1430. With the deeper undercut, the paddle central lower portion 1428 includes a horizontal width less than a horizontal width of the paddle central upper portion 1430.

It has been discovered that the package paddle 1402 improves reliability by providing additional surface areas within the lower hole 1408 and the upper hole 1414 for the encapsulation 1458 to form thereon thereby eliminating paddle detachment.

It has also been discovered that the lower non-horizontal side 1412 and the upper non-horizontal side 1418 having curve or concave surfaces covered by the encapsulation 1458 improves paddle interlocking providing improved reliability.

It has further been discovered that the paddle central lower portion 1428 having the deeper undercut further improves reliability with increased surface area of the paddle central lower portion 1428 for the encapsulation 1458 to form thereon.

Figure 15:
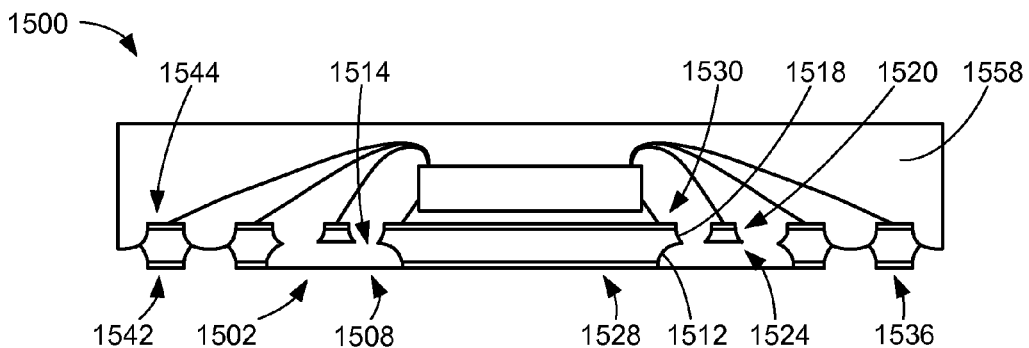
FIG. 15 is a cross-sectional view of an integrated circuit packaging system in a sixth embodiment of the present invention.

Referring now to FIG. 15, therein is shown a cross-sectional view of an integrated circuit packaging system 1500 in a sixth embodiment of the present invention. The integrated circuit packaging system 1500 can include an EMC extending beyond paddle area. The integrated circuit packaging system 1500 is similar to the integrated circuit packaging system 100 of FIG. 1.

In a manner similar to the integrated circuit packaging system 100, the integrated circuit packaging system 1500 includes a package paddle 1502 having a lower hole 1508 with a lower non-horizontal side 1512. In a manner similar to the integrated circuit packaging system 100, the package paddle 1502 includes having an upper hole 1514 with an upper non-horizontal side 1518. In a manner similar to the integrated circuit packaging system 100, the integrated circuit packaging system 1500 includes an encapsulation 1558.

The package paddle 1502 is shown with a paddle central lower portion 1528 having a deeper undercut. As used herein, the term deeper undercut means that an undercut is deeper than a cut forming a concave surface of a paddle central upper portion 1530. With the deeper undercut, the paddle central lower portion 1528 includes a horizontal width less than a horizontal width of the paddle central upper portion 1530.

The package paddle 1502 is shown without a paddle peripheral lower portion since it is completely undercut. As used herein, the term completely undercut means that the paddle peripheral lower portion is entirely removed leaving a paddle peripheral portion 1520 completely covered by the encapsulation 1558. Since the paddle peripheral portion 1520 is not directly connected to an external system (not shown), a paddle peripheral upper portion 1524 can be connected to one of terminals 1536.

One of the terminals 1536 closest to the package paddle 1502 is shown with a terminal lower portion 1542 having a deeper undercut. As used herein, the term deeper undercut means that an undercut is deeper than a cut forming a concave surface of a terminal upper portion 1544. With the deeper undercut, the terminal lower portion 1542 includes a horizontal width less than a horizontal width of the terminal upper portion 1544.

It has been discovered that the package paddle 1502 improves reliability by providing additional surface areas within the lower hole 1508 and the upper hole 1514 for the encapsulation 1558 to form thereon thereby eliminating paddle detachment.

It has also been discovered that the lower non-horizontal side 1512 and the upper non-horizontal side 1518 having curve or concave surfaces covered by the encapsulation 1558 improves paddle interlocking providing improved reliability.

It has further been discovered that the paddle peripheral portion 1520 completely covered by the encapsulation 1558 and increased surface areas of the paddle central lower portion 1528 and the terminal lower portion 1542 for the encapsulation 1558 to form thereon further improve reliability with the paddle central lower portion 1528 having the deeper undercut, the paddle peripheral lower portion completely undercut, and the terminal lower portion 1542 having a deeper undercut.

Figure 16:
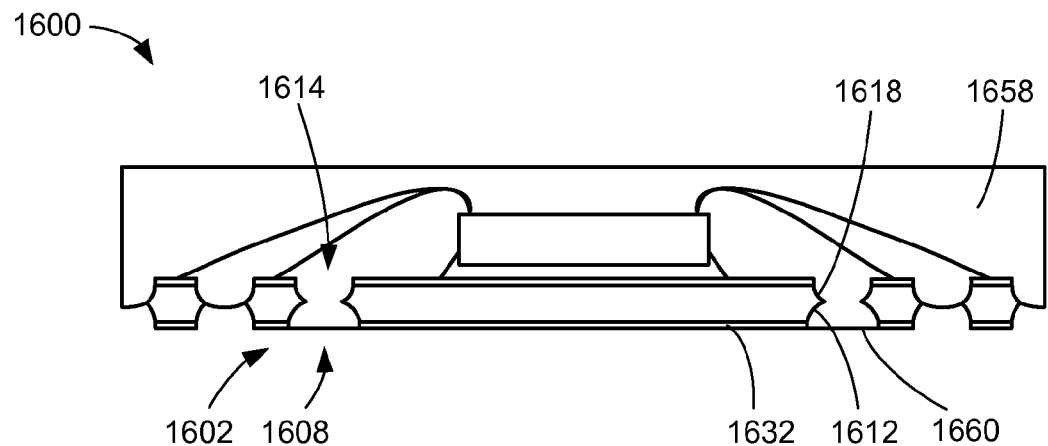
FIG. 16 is a cross-sectional view of an integrated circuit packaging system in a seventh embodiment of the present invention.

Referring now to FIG. 16, therein is shown a cross-sectional view of an integrated circuit packaging system 1600 in a seventh embodiment of the present invention. The integrated circuit packaging system 1600 can include an EMC extending to bottom paddle edge. The integrated circuit packaging system 1600 is similar to the integrated circuit packaging system 100 of FIG. 1.

In a manner similar to the integrated circuit packaging system 100, the integrated circuit packaging system 1600 includes a package paddle 1602 having a lower hole 1608 with a lower non-horizontal side 1612. In a manner similar to the integrated circuit packaging system 100, the package paddle 1602 includes an upper hole 1614 with an upper non-horizontal side 1618.

In a manner similar to the integrated circuit packaging system 100, the integrated circuit packaging system 1600 includes an encapsulation 1658. The encapsulation 1658 includes an encapsulation bottom side 1660 coplanar with a bottom side or a bottom extent of a paddle bottom conductive layer 1632.

It has been discovered that the package paddle 1602 improves reliability by providing additional surface areas within the lower hole 1608 and the upper hole 1614 for the encapsulation 1658 to form thereon thereby eliminating paddle detachment.

It has also been discovered that the lower non-horizontal side 1612 and the upper non-horizontal side 1618 having curve or concave surfaces covered by the encapsulation 1658 improves paddle interlocking providing improved reliability.

It has further been discovered that the encapsulation bottom side 1660 coplanar with a bottom side of the paddle bottom conductive layer 1632 further improves reliability with the encapsulation 1658 covering increased surface area thereby further improving paddle interlocking.

Figure 17:
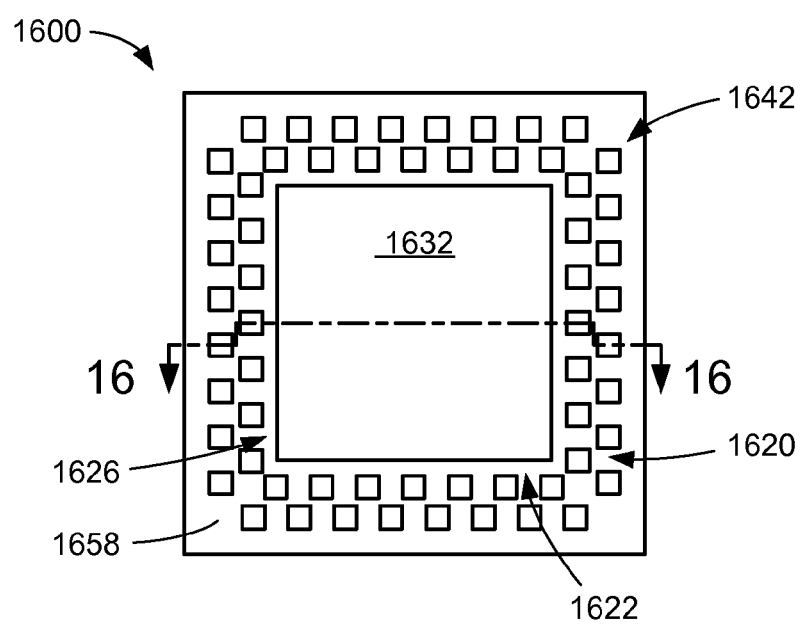
FIG. 17 is a bottom view of the integrated circuit packaging system.

Referring now to FIG. 17, therein is shown a bottom view of the integrated circuit packaging system 1600. The bottom view depicts the paddle bottom conductive layer 1632 at a paddle peripheral portion 1620 and a paddle central portion 1626.

The encapsulation 1658 can be formed between the paddle peripheral portion 1620 and the paddle central portion 1626. The encapsulation 1658 can be formed between a paddle peripheral lower portion 1622 and a terminal lower portion 1642.

Figure 18:
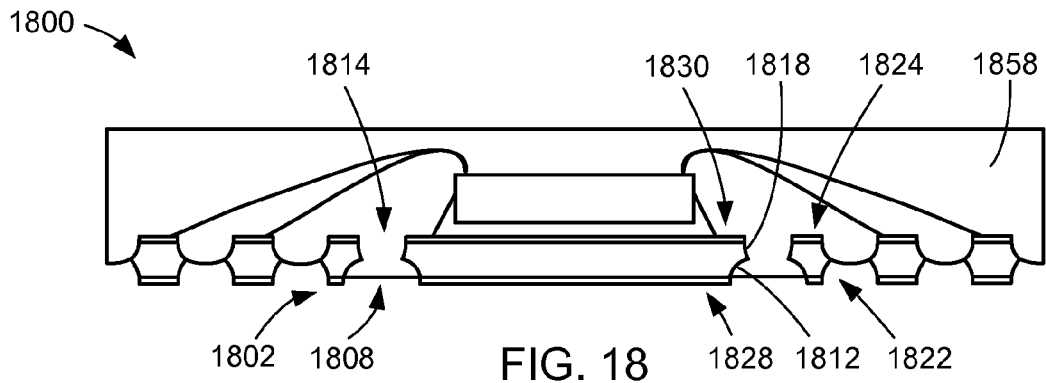
FIG. 18 is a cross-sectional view of an integrated circuit packaging system in an eighth embodiment of the present invention.

Referring now to FIG. 18, therein is shown a cross-sectional view of an integrated circuit packaging system 1800 in an eighth embodiment of the present invention. The integrated circuit packaging system 1800 can include an EMC extending to bottom paddle periphery. The integrated circuit packaging system 1800 is similar to the integrated circuit packaging system 100 of FIG. 1.

In a manner similar to the integrated circuit packaging system 100, the integrated circuit packaging system 1800 includes a package paddle 1802 having a lower hole 1808 with a lower non-horizontal side 1812. In a manner similar to the integrated circuit packaging system 100, the package paddle 1802 includes an upper hole 1814 with an upper non-horizontal side 1818. In a manner similar to the integrated circuit packaging system 100, the integrated circuit packaging system 1800 includes an encapsulation 1858.

The package paddle 1802 is shown with a paddle peripheral lower portion 1822 having a deeper undercut. As used herein, the term deeper undercut means that an undercut is deeper than a cut forming a concave surface of a paddle peripheral upper portion 1824. With the deeper undercut, the paddle peripheral lower portion 1822 can be formed having a horizontal width less than a horizontal width of the paddle peripheral upper portion 1824.

The package paddle 1802 is shown with a paddle central lower portion 1828 having a deeper undercut. As used herein, the term deeper undercut means that an undercut is deeper than a cut forming a concave surface of a paddle central upper portion 1830. With the deeper undercut, the paddle central lower portion 1828 can be formed having a horizontal width less than a horizontal width of the paddle central upper portion 1830. The paddle central lower portion 1828 can be adjacent the paddle peripheral lower portion 1822.

It has been discovered that the package paddle 1802 improves reliability by providing additional surface areas within the lower hole 1808 and the upper hole 1814 for the encapsulation 1858 to form thereon thereby eliminating paddle detachment.

It has also been discovered that the lower non-horizontal side 1812 and the upper non-horizontal side 1818 having curve or concave surfaces covered by the encapsulation 1858 improves paddle interlocking providing improved reliability.

It has further been discovered that the paddle peripheral lower portion 1822 and the paddle central lower portion 1828 having deeper undercuts further improve reliability with increased surface areas of the paddle peripheral lower portion 1822 and the paddle central lower portion 1828 for the encapsulation 1858 to form thereon.

Figure 19:
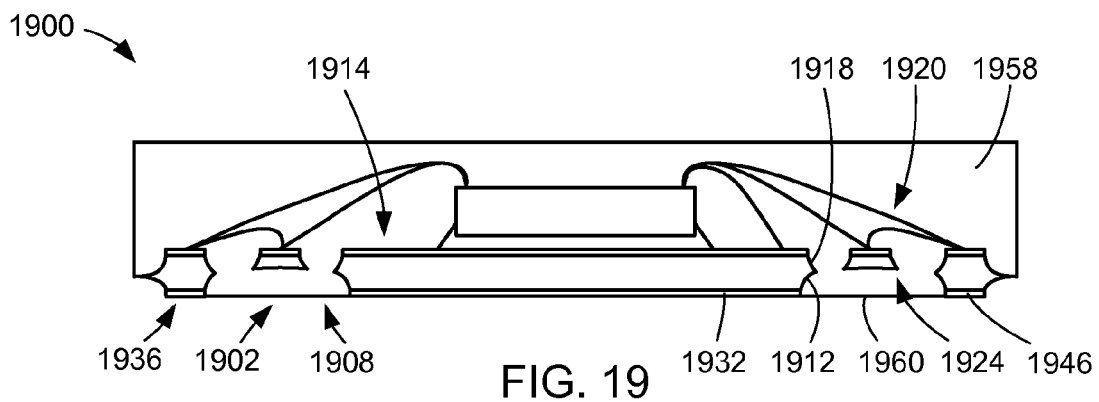
FIG. 19 is a cross-sectional view of an integrated circuit packaging system in a ninth embodiment of the present invention.

Referring now to FIG. 19, therein is shown a cross-sectional view of an integrated circuit packaging system 1900 in a ninth embodiment of the present invention. The integrated circuit packaging system 1900 can include an EMC extending below a paddle periphery. The integrated circuit packaging system 1900 is similar to the integrated circuit packaging system 100 of FIG. 1.

In a manner similar to the integrated circuit packaging system 100, the integrated circuit packaging system 1900 includes a package paddle 1902 having a lower hole 1908 with a lower non-horizontal side 1912. In a manner similar to the integrated circuit packaging system 100, the package paddle 1902 includes an upper hole 1914 with an upper non-horizontal side 1918.

In a manner similar to the integrated circuit packaging system 100, the integrated circuit packaging system 1900 includes an encapsulation 1958. The encapsulation 1958 can include an encapsulation bottom side 1960 coplanar with bottom sides of a paddle bottom conductive layer 1932 and a terminal bottom conductive layer 1946.

The package paddle 1902 is shown with a paddle peripheral lower portion completely undercut. As used herein, the term completely undercut means that the paddle peripheral lower portion is entirely removed leaving a paddle peripheral portion 1920 completely covered by the encapsulation 1958. Since the paddle peripheral portion 1920 is not directly connected to an external system (not shown), a paddle peripheral upper portion 1924 can be connected to one of terminals 1936.

It has been discovered that the package paddle 1902 improves reliability by providing additional surface areas within the lower hole 1908 and the upper hole 1914 for the encapsulation 1958 to form thereon thereby eliminating paddle detachment.

It has also been discovered that the lower non-horizontal side 1912 and the upper non-horizontal side 1918 having curve or concave surfaces covered by the encapsulation 1958 improves paddle interlocking providing improved reliability.

It has further been discovered that the paddle peripheral portion 1920 completely covered by the encapsulation 1958 further improves reliability with the paddle peripheral lower portion completely undercut.

Figure 20:
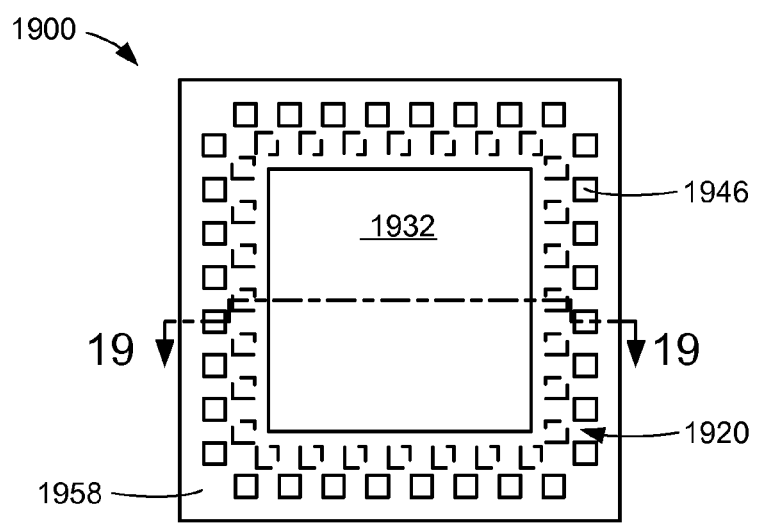
FIG. 20 is a bottom view of the integrated circuit packaging system.

Referring now to FIG. 20, therein is shown a bottom view of the integrated circuit packaging system 1900. The bottom view depicts a number of the terminal bottom conductive layer 1946 surrounding the paddle bottom conductive layer 1932.

The terminal bottom conductive layer 1946 and the paddle bottom conductive layer 1932 can be exposed from the encapsulation 1958. The paddle peripheral portion 1920, shown as dash rectangles, can be completely covered by the encapsulation 1958. The encapsulation 1958 can be filled in a volume under the paddle peripheral portion 1920.

Figure 21:
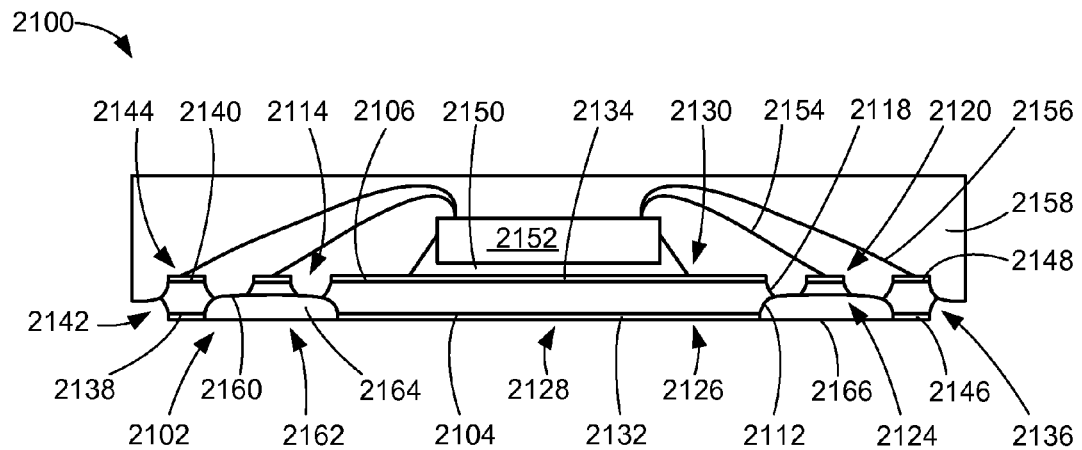
FIG. 21 is a cross-sectional view of an integrated circuit packaging system in a tenth embodiment of the present invention.

Referring now to FIG. 21, therein is shown a cross-sectional view of an integrated circuit packaging system 2100 in a tenth embodiment of the present invention. The integrated circuit packaging system 2100 can include an undercut locking structure.

The integrated circuit packaging system 2100 can include a package paddle 2102, which is defined as a support structure for mounting and connecting an integrated circuit device thereon. The package paddle 2102 can include a paddle bottom side 2104 and a paddle top side 2106.

The package paddle 2102 can include an upper hole 2114 bounded by an upper non-horizontal side 2118. The upper non-horizontal side 2118 can include a curve or concave surface.

The package paddle 2102 can include a paddle peripheral portion 2120 having a paddle peripheral upper portion 2124. The package paddle 2102 can include a paddle central portion 2126 having a paddle central lower portion 2128 and a paddle central upper portion 2130. The upper hole 2114 defines spacing between the paddle peripheral upper portion 2124 and the paddle central upper portion 2130.

The paddle peripheral portion 2120 is defined as a portion of the package paddle 2102 that is horizontally farther from the center of the package paddle 2102 than the paddle central portion 2126 from the center of the package paddle 2102. The paddle peripheral portion 2120 can be adjacent and surrounding the paddle central portion 2126. The paddle central portion 2126 is defined as a portion of the package paddle 2102 that is at the center of the package paddle 2102.

The package paddle 2102 can include a paddle bottom conductive layer 2132, which is defined as a conductor that provides electrical connectivity between the package paddle 2102 and an external system (not shown). The paddle bottom conductive layer 2132 can be formed directly on the paddle bottom side 2104 at the paddle central lower portion 2128.

The package paddle 2102 can include a paddle top conductive layer 2134, which is defined as a conductor that provides electrical connectivity between the package paddle 2102 and an integrated circuit device. The paddle top conductive layer 2134 can be formed directly on the paddle top side 2106 at the paddle peripheral upper portion 2124 and the paddle central upper portion 2130.

The integrated circuit packaging system 2100 can include terminals 2136, which are defined as connectors providing electrical connectivity between an integrated circuit device and the external system. The terminals 2136 can be adjacent and surrounding the paddle peripheral portion 2120. For example, the terminals 2136 can represent island terminals that are isolated from each other.

The terminals 2136 can be electrically isolated from the package paddle 2102. Each of the terminals 2136 can include a terminal bottom side 2138 and a terminal top side 2140. Each of the terminals 2136 can include a terminal lower portion 2142 and a terminal upper portion 2144.

Each of the terminals 2136 can include a terminal bottom conductive layer 2146, which is defined as a conductor that provides electrical connectivity between each of the terminals 2136 and the external system. The terminal bottom conductive layer 2146 can be formed directly on the terminal bottom side 2138 at the terminal lower portion 2142.

Each of the terminals 2136 can include a terminal top conductive layer 2148, which is defined as a conductor that provides electrical connectivity between each of the terminals 2136 and an integrated circuit device. The terminal top conductive layer 2148 can be formed directly on the terminal top side 2140 at the terminal upper portion 2144.

The paddle bottom side 2104 and the terminal bottom side 2138 can be coplanar with each other. The paddle bottom conductive layer 2132 and the terminal bottom conductive layer 2146 can be coplanar with each other. The paddle top side 2106 and the terminal top side 2140 can be coplanar with each other. The paddle top conductive layer 2134 and the terminal top conductive layer 2148 can be coplanar with each other.

The integrated circuit packaging system 2100 can include an attach layer 2150, which is defined as a die attach material or an adhesive material. The integrated circuit packaging system 2100 can include an integrated circuit 2152, which is defined as a semiconductor device, having an inactive side attached to the paddle top conductive layer 2134 with the attach layer 2150. The integrated circuit 2152 can be mounted with the inactive side over the paddle central upper portion 2130.

The integrated circuit packaging system 2100 can include paddle-device connectors 2154 and terminal-device connectors 2156, which are defined as electrical connectors. The paddle-device connectors 2154 can be attached to an active side of the integrated circuit 2152 and the paddle top conductive layer 2134. Each of the terminal-device connectors 2156 can be connected to the active side and the terminal top conductive layer 2148.

The integrated circuit packaging system 2100 can include an encapsulation 2158, which is defined as a package cover of a semiconductor package to seal an integrated circuit device providing mechanical and environmental protection. The encapsulation 2158 can be formed over the package paddle 2102, the terminals 2136, the attach layer 2150, the integrated circuit 2152, the paddle-device connectors 2154, and the terminal-device connectors 2156.

The encapsulation 2158 can cover the upper non-horizontal side 2118 within the upper hole 2114. The encapsulation 2158 can cover the paddle peripheral upper portion 2124, the paddle central upper portion 2130, and the terminal upper portion 2144. The encapsulation 2158 can expose a portion of the terminal lower portion 2142. The encapsulation 2158 can include an encapsulation bottom side 2160.

The package paddle 2102 can include a bottom hole 2162 under the paddle peripheral upper portion 2124. The bottom hole 2162 can be bounded by non-horizontal surfaces of the paddle central lower portion 2128 and the terminal lower portion 2142 nearest the paddle central lower portion 2128. The bottom hole 2162 can be between the paddle bottom conductive layer 2132 and the terminal bottom conductive layer 2146 at one of the terminals 2136 nearest the package paddle 2102.

The integrated circuit packaging system 2100 can include an additional encapsulation 2164, which is defined as a cover of a semiconductor package providing mechanical and environmental protection. The additional encapsulation 2164 can include a molding material including a B-stage material or an encapsulant.

The additional encapsulation 2164 can be formed within the bottom hole 2162. The additional encapsulation 2164 can cover a bottom side or a bottom extent of the paddle peripheral upper portion 2124. The additional encapsulation 2164 can cover the encapsulation bottom side 2160 within the bottom hole 2162. The additional encapsulation 2164 can cover non-horizontal surfaces of the paddle central lower portion 2128 and the terminal lower portion 2142 within the bottom hole 2162 with the terminal lower portion 2142 nearest the paddle central lower portion 2128.

The paddle peripheral portion 2120 can be completely covered by a combination of the encapsulation 2158 and the additional encapsulation 2164. Since the paddle peripheral portion 2120 is not directly connected to the external system, the paddle peripheral upper portion 2124 can be connected to one of the terminals 2136.

It has been discovered that the package paddle 2102 improves reliability by providing additional surface areas within the upper hole 2114 for the encapsulation 2158 to form thereon thereby eliminating paddle detachment.

It has also been discovered that a lower non-horizontal side 2112 and the upper non-horizontal side 2118 having curve or concave surfaces covered by the additional encapsulation 2164 and the encapsulation 2158, respectively, improve paddle interlocking providing improved reliability.

It has further been discovered that improved structural integrity is provided with the paddle peripheral portion 2120 completely covered within the bottom hole 2162 by the additional encapsulation 2164 covering a bottom extent of the paddle peripheral upper portion 2124 and by the additional encapsulation 2164 having an additional encapsulation bottom side 2166 coplanar with bottom sides of the paddle bottom conductive layer 2132 and the terminal bottom conductive layer 2146.

Figure 22:
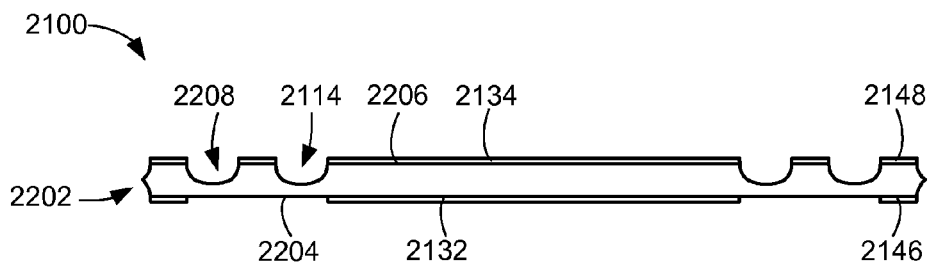
FIG. 22 is a cross-sectional view of the integrated circuit packaging system in a leadframe-providing phase of manufacture.

Referring now to FIG. 22, therein is shown a cross-sectional view of the integrated circuit packaging system 2100 in a leadframe-providing phase of manufacture. The integrated circuit packaging system 2100 can include a leadframe 2202, which is defined as a structure providing support and connectivity for an integrated circuit device.

The leadframe 2202 can include a leadframe bottom side 2204 and a leadframe top side 2206. The leadframe 2202 can include a partially removed region 2208 extending below the leadframe top side 2206. The partially removed region 2208 defines the upper hole 2114.

The leadframe 2202 can include the paddle bottom conductive layer 2132 and the terminal bottom conductive layer 2146 with both formed directly on the leadframe bottom side 2204. The leadframe 2202 can include the paddle top conductive layer 2134 and the terminal top conductive layer 2148 with both formed directly on the leadframe top side 2206.

The leadframe 2202 can be formed with an electrically conductive material including copper (Cu) or any other metallic material. The leadframe 2202 can be formed with a material that can be etched or partially removed.

The paddle bottom conductive layer 2132, the paddle top conductive layer 2134, the terminal bottom conductive layer 2146, and the terminal top conductive layer 2148 can be formed with a pattern process including a pre-plated leadframe (PPF) plating process. The paddle bottom conductive layer 2132, the paddle top conductive layer 2134, the terminal bottom conductive layer 2146, and the terminal top conductive layer 2148 can be formed with a material that is resistant to a removal process including etching.

The paddle bottom conductive layer 2132, the paddle top conductive layer 2134, the terminal bottom conductive layer 2146, and the terminal top conductive layer 2148 can include a conductive material or a metal alloy. For example, the paddle bottom conductive layer 2132, the paddle top conductive layer 2134, the terminal bottom conductive layer 2146, and the terminal top conductive layer 2148 can include nickel (Ni), palladium (Pd), gold (Au), or any combination thereof. For a specific example, the paddle bottom conductive layer 2132, the paddle top conductive layer 2134, the terminal bottom conductive layer 2146, and the terminal top conductive layer 2148 can include nickel-palladium-gold.

The partially removed region 2208 and the upper hole 2114 can be formed with a removal process including etching by removing portions of the leadframe 2202 around the paddle top conductive layer 2134 and the terminal top conductive layer 2148. The removal process can be performed to remove portions of the leadframe 2202 at the leadframe top side 2206 to form the partially removed region 2208 and the upper hole 2114.

Figure 23:
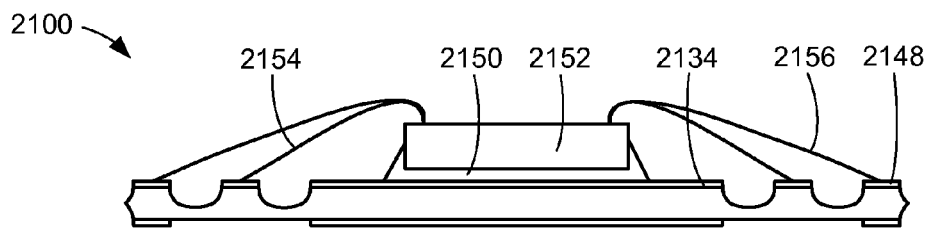
FIG. 23 is the structure of FIG. 22 in a connecting phase.

Referring now to FIG. 23, therein is shown the structure of FIG. 22 in a connecting phase. The integrated circuit packaging system 2100 can include an attach process including die attach to attach the integrated circuit 2152 to the paddle top conductive layer 2134 with the attach layer 2150.

The integrated circuit packaging system 2100 can include a connection process including wire bonding to attach the paddle-device connectors 2154 to the integrated circuit 2152 and the paddle top conductive layer 2134. The connection process can also be performed to attach the terminal-device connectors 2156 to the integrated circuit 2152 and the terminal top conductive layer 2148.

Figure 24:
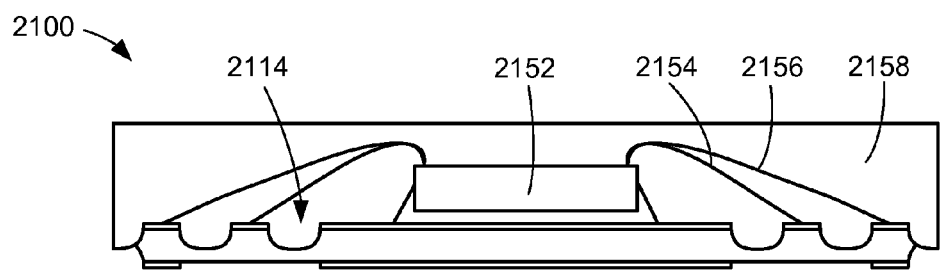
FIG. 24 is the structure of FIG. 23 in a first molding phase.

Referring now to FIG. 24, therein is shown the structure of FIG. 23 in a first molding phase. The encapsulation 2158 can be formed over the integrated circuit 2152, the paddle-device connectors 2154, and the terminal-device connectors 2156. The encapsulation 2158 can be formed within the upper hole 2114. The encapsulation 2158 can be formed with a molding material including an epoxy molding compound (EMC) or an encapsulant.

Figure 25:
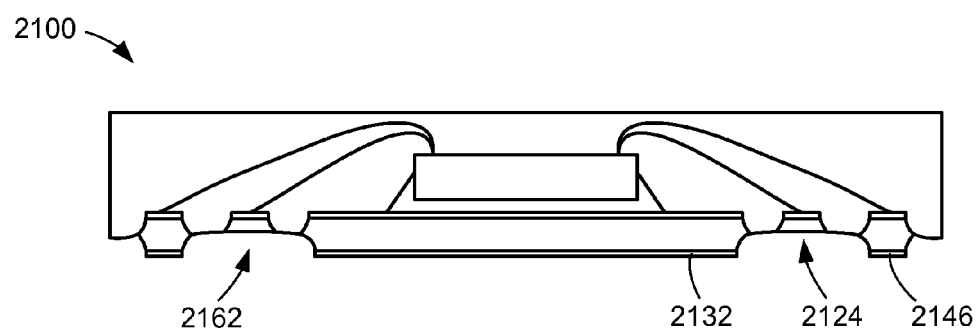
FIG. 25 is the structure of FIG. 24 in a removal phase.

Referring now to FIG. 25, therein is shown the structure of FIG. 24 in a removal phase. The integrated circuit packaging system 2100 can include a removal process including bottom etching to remove a portion of the leadframe 2202 of FIG. 22 at the leadframe bottom side 2204 of FIG. 22. The portion of the leadframe 2202 removed can be between the paddle bottom conductive layer 2132 and the terminal bottom conductive layer 2146 forming the bottom hole 2162 exposing a bottom side of the paddle peripheral upper portion 2124.

Figure 26:
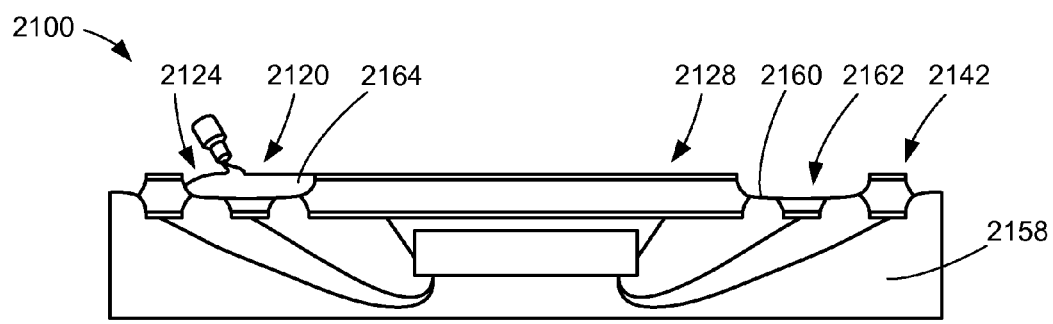
FIG. 26 is the structure of FIG. 25 in a second molding phase.

Referring now to FIG. 26, therein is shown the structure of FIG. 25 in a second molding phase. FIG. 26 depicts the structure of FIG. 25 in a vertically inverted position. The additional encapsulation 2164 can be filled within the bottom hole 2162. The additional encapsulation 2164 can cover a bottom side of the paddle peripheral upper portion 2124 and the encapsulation bottom side 2160 within the bottom hole 2162.

The additional encapsulation 2164 can also cover non-horizontal surfaces of the paddle central lower portion 2128 and the terminal lower portion 2142 within the bottom hole 2162. The paddle peripheral portion 2120 can be completely covered by a combination of the encapsulation 2158 and the additional encapsulation 2164.

In a subsequent phase, the integrated circuit packaging system 2100 can include a package singulation process to produce individual units or packages of the integrated circuit packaging system 2100. The package singulation process can include a mechanical or optical process.

Figure 27:
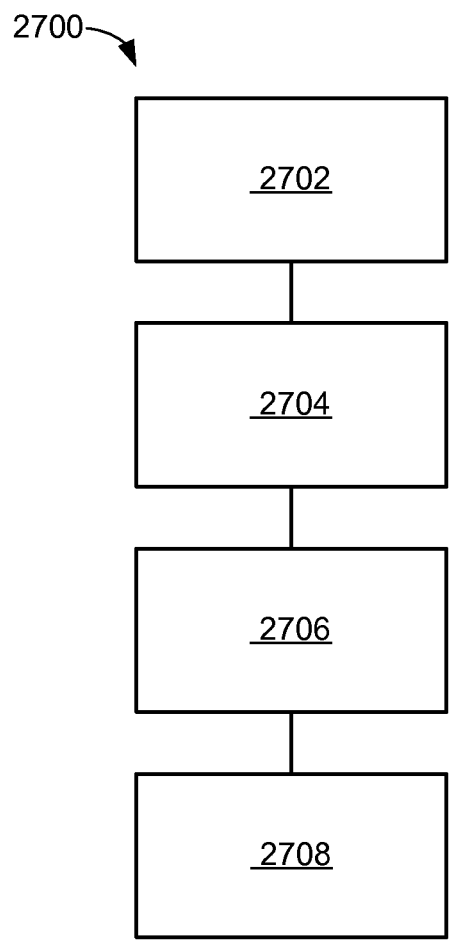
FIG. 27 is a flow chart of a method of manufacture of the integrated circuit packaging system in a further embodiment of the present invention.

Referring now to FIG. 27, therein is shown a flow chart of a method 2700 of manufacture of the integrated circuit packaging system in a further embodiment of the present invention. The method 2700 includes: providing a package paddle having an upper hole below a paddle top side, the upper hole bounded by an upper non-horizontal side with a curve surface in a block 2702; forming a terminal adjacent the package paddle in a block 2704; mounting an integrated circuit on the paddle top side in a block 2706; and forming an encapsulation within the upper hole in a block 2708.

Figure 28:
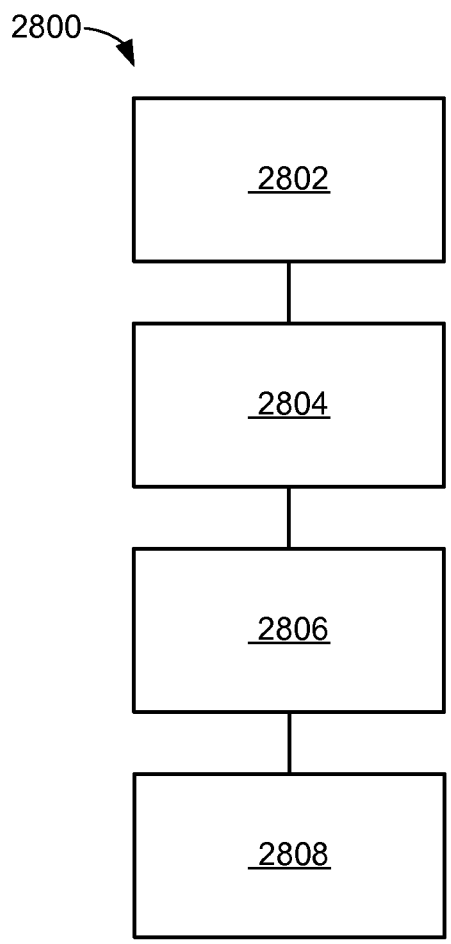
FIG. 28 is a flow chart of a method of manufacture of the integrated circuit packaging system in a further embodiment of the present invention.

Referring now to FIG. 28, therein is shown a flow chart of a method 2800 of manufacture of the integrated circuit packaging system in a further embodiment of the present invention. The method 2800 includes: providing a package paddle having a paddle bottom side, a paddle bottom conductive layer, and a lower non-horizontal side with the lower non-horizontal side having a curve surface in a block 2802; forming a terminal adjacent the package paddle, the terminal having a terminal bottom side and a terminal lower portion with the terminal lower portion having a non-horizontal extent facing the lower non-horizontal side in a block 2804; mounting an integrated circuit over the package paddle in a block 2806; and forming an encapsulation over the integrated circuit, the encapsulation covering the non-horizontal extent and the lower non-horizontal side, the encapsulation having an encapsulation bottom side horizontally extending from the paddle bottom side to the terminal bottom side in a block 2808.

Thus, it has been discovered that the integrated circuit packaging system of the present invention furnishes important and heretofore unknown and unavailable solutions, capabilities, and functional aspects for an integrated circuit packaging system with island terminals. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   providing a package paddle having a peripheral portion, a central portion, and an upper hole, wherein the peripheral portion is spaced away from the central portion, and the upper hole is below a paddle top side, horizontally between the peripheral portion and the central portion, and bounded by an upper non-horizontal side with a curve surface;
   forming a terminal adjacent the package paddle;
   mounting an integrated circuit on the paddle top side; and
   forming an encapsulation within the upper hole.

2. The method as claimed in claim 1 wherein:
   providing the package paddle includes providing the package paddle having a lower hole opposite the upper hole; and
   forming the encapsulation includes forming the encapsulation exposed within the lower hole.

3. The method as claimed in claim 1 wherein providing the package paddle includes providing the package paddle having a paddle peripheral lower portion with a horizontal width less than a horizontal width of a paddle peripheral upper portion.

4. The method as claimed in claim 1 wherein providing the package paddle includes providing the package paddle having a paddle central lower portion with a horizontal width less than a horizontal width of a paddle central upper portion.

5. The method as claimed in claim 1 wherein:
   providing the package paddle includes providing the package paddle having a paddle peripheral portion; and
   forming the encapsulation includes forming the encapsulation completely covering the paddle peripheral portion.

6. A method of manufacture of an integrated circuit packaging system comprising:
   providing a package paddle having a peripheral portion, a central portion, and an upper hole, wherein the peripheral portion is spaced away from the central portion, and the upper hole is below a paddle top side, horizontally between the peripheral portion and the central portion, and bounded by an upper non-horizontal side with a curve surface;
   forming a terminal adjacent the package paddle;
   mounting an integrated circuit on the paddle top side;
   attaching a terminal-device connector to the integrated circuit and the terminal; and
   forming an encapsulation within the upper hole.

7. The method as claimed in claim 6 wherein:
   providing the package paddle includes providing the package paddle having a paddle bottom conductive layer; and
   forming the encapsulation includes forming the encapsulation having an encapsulation bottom side coplanar with the paddle bottom conductive layer.

8. The method as claimed in claim 6 wherein:
   providing the package paddle includes:
      forming a paddle peripheral lower portion having a horizontal width less than a horizontal width of a paddle peripheral upper portion, and
      forming a paddle central lower portion adjacent the paddle peripheral lower portion, the paddle central lower portion having a horizontal width less than a horizontal width of a paddle central upper portion.

9. The method as claimed in claim 6 wherein:
   providing the package paddle includes providing the package paddle having a paddle bottom conductive layer; and
   forming the encapsulation includes forming the encapsulation having an encapsulation bottom side coplanar with the paddle bottom conductive layer.

10. The method as claimed in claim 6 wherein:
    providing the package paddle includes providing the package paddle having a paddle peripheral upper portion; and
    further comprising:
       forming an additional encapsulation covering a bottom extent of the paddle peripheral upper portion.

11. An integrated circuit packaging system comprising:
    a package paddle having a peripheral portion, a central portion, and an upper hole, wherein the peripheral portion is spaced away from the central portion, and the upper hole is below a paddle top side, horizontally between the peripheral portion and the central portion, and bounded by an upper non-horizontal side with a curve surface;
    a terminal adjacent the package paddle;
    an integrated circuit on the paddle top side; and
    an encapsulation within the upper hole.

12. The system as claimed in claim 11 wherein:
the package paddle includes a lower hole opposite the upper hole; and
the encapsulation is exposed within the lower hole.

13. The system as claimed in claim 11 wherein the package paddle includes a paddle peripheral lower portion with a horizontal width less than a horizontal width of a paddle peripheral upper portion.

14. The system as claimed in claim 11 wherein the package paddle includes a paddle central lower portion with a horizontal width less than a horizontal width of a paddle central upper portion.

15. The system as claimed in claim 11 wherein:
the package paddle includes a paddle peripheral portion; and
the encapsulation completely covers the paddle peripheral portion.

16. The system as claimed in claim 11 further comprising a terminal-device connector attached to the integrated circuit and the terminal.

17. The system as claimed in claim 16 wherein:
the package paddle includes a paddle bottom conductive layer; and
the encapsulation includes an encapsulation bottom side coplanar with the paddle bottom conductive layer.

18. The system as claimed in claim 16 wherein:
the package paddle includes:
a paddle peripheral lower portion having a horizontal width less than a horizontal width of a paddle peripheral upper portion, and
a paddle central lower portion adjacent the paddle peripheral lower portion, the paddle central lower portion having a horizontal width less than a horizontal width of a paddle central upper portion.

19. The system as claimed in claim 16 wherein:
the package paddle includes a paddle bottom conductive layer; and
the encapsulation includes an encapsulation bottom side coplanar with the paddle bottom conductive layer.

20. The system as claimed in claim 16 wherein:
the package paddle includes a paddle peripheral upper portion; and
further comprising:
an additional encapsulation covering a bottom extent of the paddle peripheral upper portion.

21. A method of manufacture of an integrated circuit packaging system comprising:

providing a package paddle having a peripheral portion, a central portion, a paddle bottom side, a paddle bottom conductive layer, and a lower non-horizontal side with the lower non-horizontal side having a curve surface, wherein the peripheral portion is spaced away from the central portion, and the upper hole is horizontally between the peripheral portion and the central portion surface;

forming a terminal adjacent the package paddle, the terminal having a terminal bottom side and a terminal lower portion with the terminal lower portion having a non-horizontal extent facing the lower non-horizontal side;

mounting an integrated circuit over the package paddle; and forming an encapsulation over the integrated circuit, the encapsulation covering the non-horizontal extent and the lower non-horizontal side, the encapsulation having an encapsulation bottom side horizontally extending from the paddle bottom side to the terminal bottom side.

22. An integrated circuit packaging system comprising:

a package paddle having a peripheral portion, a central portion, a paddle bottom side, a paddle bottom conductive layer, and a lower non-horizontal side with the lower non-horizontal side having a curve surface, wherein the peripheral portion is spaced away and the upper hole is horizontally between the peripheral portion and the central portion;

a terminal adjacent the package paddle, the terminal having a terminal bottom side and a terminal lower portion with the terminal lower portion having a non-horizontal extent facing the lower non-horizontal side;

an integrated circuit over the package paddle; and an encapsulation over the integrated circuit, the encapsulation covering the non-horizontal extent and the lower non-horizontal side, the encapsulation having an encapsulation bottom side horizontally extending from the paddle bottom side to the terminal bottom side.

\* \* \* \* \*

UNITED STATES PATENT AND TRADEMARK OFFICE
CERTIFICATE OF CORRECTION

| | | |
|---|---|---|
| PATENT NO. | : 8,802,501 B2 | Page 1 of 1 |
| APPLICATION NO. | : 13/188456 | |
| DATED | : August 12, 2014 | |
| INVENTOR(S) | : Camacho et al. | |

It is certified that error appears in the above-identified patent and that said Letters Patent is hereby corrected as shown below:

In the Claims:

1. Column 24, claim 21, line 11, delete "surface"
2. Column 24, claim 22, line 30, delete "away and" and insert therefor
   --away from the central portion, and--

Signed and Sealed this
Fifth Day of April, 2016

Michelle K. Lee
*Director of the United States Patent and Trademark Office*